US009448490B2

(12) United States Patent
Dinger et al.

(10) Patent No.: US 9,448,490 B2
(45) Date of Patent: Sep. 20, 2016

(54) EUV LITHOGRAPHY SYSTEM

(71) Applicant: Carl Zeiss SMT GmbH, Oberkochen (DE)

(72) Inventors: Udo Dinger, Oberkochen (DE); Lars Wischmeier, Aalen (DE); Markus Hauf, Ulm (DE); Stephan Kellner, Westhausen (DE); Igor Gurevich, Saarbruecken (DE); Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 475 days.

(21) Appl. No.: 13/910,912

(22) Filed: Jun. 5, 2013

(65) Prior Publication Data
US 2013/0265560 A1 Oct. 10, 2013

Related U.S. Application Data

(63) Continuation of application No. PCT/EP2011/006229, filed on Dec. 9, 2011.

(30) Foreign Application Priority Data

Dec. 9, 2010 (DE) .................. 10 2010 062 720

(51) Int. Cl.
*G03B 27/52* (2006.01)
*G03B 27/42* (2006.01)
*G03F 7/20* (2006.01)

(52) U.S. Cl.
CPC ............... *G03F 7/702* (2013.01); *G03F 7/708* (2013.01); *G03F 7/70058* (2013.01); *G03F 7/70075* (2013.01); *G03F 7/70085* (2013.01); *G03F 7/70116* (2013.01); *G03F 7/70483* (2013.01)

(58) Field of Classification Search
CPC .. G03F 7/70058; G03F 7/702; G03F 7/7085; G03F 7/70191; G03F 7/20; G03F 7/70141; G03F 7/70225; G03F 7/70558; G03F 7/70616; G03F 7/7055; G03F 7/70825; G03F 7/70; G03F 7/7008; G03F 7/70025; G03F 7/70441; G03F 7/70091; G03F 7/70391
See application file for complete search history.

(56) References Cited

U.S. PATENT DOCUMENTS

| 6,198,793 B1 | 3/2001 | Schultz et al. |
| 7,605,926 B1 | 10/2009 | Hetzler et al. |

(Continued)

FOREIGN PATENT DOCUMENTS

| DE | 10 2007 005 875 | 8/2008 |
| DE | 10 2008 040 742 | 2/2009 |

(Continued)

OTHER PUBLICATIONS

The International Search Report and a Written Opinion from the counterpart PCT Application No. PCT/EP2011/006229, dated Mar. 7, 2012.

(Continued)

Primary Examiner — Mesfin T Asfaw
(74) Attorney, Agent, or Firm — Fish & Richardson P.C.

(57) ABSTRACT

An EUV lithography system 1 comprises an EUV beam path and a monitor beam path 51.

The EUV beam path comprises a mirror system 13, which has a base and a multiplicity of mirror elements 17 having concave mirror surfaces, the orientation of which relative to the base is respectively adjustable.

The monitor beam path 51 comprises at least one monitor radiation source 53, a screen 71, the mirror system 13, which is arranged in the monitor beam path 51 between the monitor radiation source 53 and the screen 71, and a spatially resolving detector 77.

In this case, each of a plurality of the mirror elements generates an image of the monitor radiation source in an image plane assigned to the respective mirror elements, distances B between the image planes assigned to the mirror elements and the screen have a maximum distance, distances A between each of the plurality of mirror elements and the image plane assigned to it have a minimum distance, and the maximum distance B is less than half of the minimum distance A.

19 Claims, 9 Drawing Sheets

(56) References Cited

U.S. PATENT DOCUMENTS

| | | | |
|---|---|---|---|
| 8,228,417 B1* | 7/2012 | Georgiev et al. | 348/340 |
| 2002/0136351 A1 | 9/2002 | Singer | |
| 2008/0068609 A1 | 3/2008 | Werkman et al. | |
| 2008/0079930 A1 | 4/2008 | Klarenbeek | |
| 2009/0135392 A1* | 5/2009 | Muramatsu | 355/67 |
| 2010/0039629 A1 | 2/2010 | Xalter et al. | |
| 2010/0103400 A1 | 4/2010 | Deguenther et al. | |
| 2011/0001947 A1 | 1/2011 | Dinger et al. | |
| 2011/0141445 A1 | 6/2011 | Endres et al. | |
| 2011/0188017 A1 | 8/2011 | Horn et al. | |
| 2011/0235015 A1 | 9/2011 | Dengel et al. | |
| 2011/0273694 A1 | 11/2011 | Werber et al. | |
| 2013/0088698 A1 | 4/2013 | Horn et al. | |

FOREIGN PATENT DOCUMENTS

| | | |
|---|---|---|
| DE | 10 2009 025 655 | 3/2010 |
| DE | 10 2008 050 446 | 4/2010 |
| DE | 10 2009 032 194 | 4/2010 |
| DE | 10 2009 025 664 | 5/2010 |
| DE | 10 2009 033 223 | 5/2010 |
| DE | 10 2009 019 254 | 6/2010 |
| DE | 10 2009 000 099 | 7/2010 |
| DE | 10 2009 028 773 | 7/2010 |
| DE | 10 2009 009 372 | 8/2010 |
| DE | 10 2009 054 540 | 6/2011 |
| EP | 1 202 101 A2 | 5/2002 |
| JP | 2008-085326 A | 4/2008 |
| JP | 2008-091907 A | 4/2008 |
| JP | 2009-117671 A | 5/2009 |
| JP | 2010-518595 A | 5/2010 |
| JP | 2010-141071 A | 6/2010 |
| WO | WO 2005/015314 A2 | 2/2005 |
| WO | WO 2010/008993 A1 | 1/2010 |
| WO | WO 2010/102649 | 9/2010 |

OTHER PUBLICATIONS

German Office Action, with translation thereof, for DE Appl No. 10 2010 062 720.8, dated Aug. 4, 2011.

Japanese Office Action, with English translation, for JP Appl No. 2013-542413, dated Sep. 11, 2015.

Taiwanese Office Action and Search Report, with translation thereof, for corresponding TW Appl No. 100145488, dated Jan. 14, 2016.

\* cited by examiner

EUV LITHOGRAPHY SYSTEM

CROSS-REFERENCE TO RELATED APPLICATIONS

The present application is a continuation of, and claims benefit under 35 U.S.C. 120 to, international application PCT/EP2011/006229, filed Dec. 9, 2011, which claims benefit under 35 U.S.C. 119 of German Application No. DE 10 2010 062 720.8, filed Dec. 9, 2010. International application PCT/EP2011/006229 incorporates by reference DE 10 2010 062 720.8. The entire disclosure of international application PCT/EP2011/006229 is incorporated by reference herein.

FIELD

The invention relates to an EUV lithography system which can be used for producing miniaturised components by imaging a structure to be imaged, which is also designated as a mask or reticle, using EUV radiation onto a radiation-sensitive structure, which is also designated as a resist. The EUV radiation is ultraviolet radiation, in particular having wavelengths from the range of extreme ultraviolet (EUV), such as, for example, having wavelengths from the range of 5 nm to 30 nm.

BACKGROUND

An EUV lithography system known from EP 1 202 101 A2 comprises imaging optics configured for imaging an object plane, in which a structure to be imaged can be arranged, into an image plane, in which a radiation-sensitive structure can be arranged, an EUV radiation source, and a first mirror system, which is arranged in an EUV beam path between the EUV radiation source and the object plane and which comprises a base and a plurality of mirror elements which are fixed to the base, the mirror surfaces of which have a concave shape and the orientation of which relative to the base is adjustable in order to enable different settings of an angular distribution of the EUV radiation impinging on the structure to be imaged.

There is a problem in adjusting the plurality of mirror elements of the mirror system relative to the base thereof such that a desired setting of the angular distribution is achieved and the latter is also maintained during operation of the EUV lithography system.

SUMMARY

Accordingly, it is an object of the present invention to propose a lithography system of the type outlined above which provides a possibility for detecting orientations of at least some mirror elements of a mirror system arranged in an EUV beam path between an EUV radiation source and a structure to be imaged relative to a base of the mirror system.

Embodiments of an EUV lithography system comprise an EUV beam path and a monitor beam path, wherein the EUV lithography system has in the EUV beam path: imaging optics configured for imaging an object plane, in which a structure to be imaged can be arranged, into an image plane, in which a radiation-sensitive structure can be arranged, an EUV radiation source, a first mirror system, which is arranged in the EUV beam path between the EUV radiation source and the object plane and which comprises a base and a plurality of mirror elements, wherein orientations of the mirror surfaces relative to the base are respectively adjustable.

According to embodiments herein, the EUV lithography system further comprises in the monitor beam path: at least one monitor radiation source, a screen, the first mirror system, which is arranged in the monitor beam path between the monitor radiation source and the screen, and a detector, which is configured for detecting in a spatially resolved manner radiation intensities impinging on the screen, wherein the monitor radiation source, the first mirror system and the screen are arranged relative to one another such that the following holds true: each of a plurality of the mirror elements generates an image of the monitor radiation source in an image plane assigned to the respective mirror element, distances between the image planes assigned to the mirror elements and the screen have a maximum distance, distances between each of the plurality of mirror elements and the image plane assigned to it have a minimum distance, and the maximum distance is less than half of the minimum distance.

The plurality of mirror elements respectively generate an image of the monitor radiation source, for which purpose, in the monitor beam path, provision can be made of lens elements for correspondingly shaping monitor rays and/or the mirror surfaces can have a concave shape. The monitor radiation source can be a substantially punctiform radiation source but also an extended radiation source. Depending on the quality of the imaging of the monitor radiation source by a respective mirror element, the image of the monitor radiation source that is generated by the mirror element may be substantially punctiform, that is to say have a small lateral extent, or it may have a significant lateral extent of, for example, one or a plurality of millimeters. The image planes of the images of the at least one monitor radiation source which are generated by the mirror elements do not have to lie in a common plane. The screen is arranged near the images, as seen in the direction of the rays which generate the images of the monitor radiation source, since the maximum distance between the image planes assigned to the mirror elements and the screen is less than half of the minimum distance between the image planes and the respective mirror elements. Therefore, the rays which image the at least one monitor radiation source via the mirror elements generate on the screen in each case a light spot which can have a small extent—in comparison with the diameter of the screen—of, for example, less than one or a plurality of millimeters. The positions of the light spots generated on the screen in this way are characteristic of the orientations of the mirror elements, since a change in the orientation of one of the mirror elements leads to a change in the light spot generated on the screen by the mirror element. The light spots can be detected in a spatially resolved manner by the detector, such that the orientations of the mirror elements relative to the base of the first mirror system can be determined from detection signals of the detector.

Further embodiments an EUV lithography system comprise an EUV beam path and a monitor beam path, wherein the EUV lithography system comprises in the EUV beam path: imaging optics configured for imaging an object plane, in which a structure to be imaged can be arranged, into an image plane, in which a radiation-sensitive structure can be arranged, an EUV radiation source, a first mirror system, which is arranged in the EUV beam path between the EUV radiation source and the object plane and which comprises a base and a plurality of mirror elements fixed to the base, wherein orientations of the mirror surfaces relative to the base are respectively adjustable, and wherein the EUV lithography system comprises in the monitor beam path: one or a plurality of monitor radiation sources, a detector, and the first mirror system, which is arranged in the monitor beam path between the monitor radiation source or the plurality of monitor radiation sources and the detector, wherein the detector is a plenoptic camera.

In contrast to a camera which allows the two-dimensional detection of light intensities, the plenoptic camera can detect light intensities of a four-dimensional light field, wherein, alongside two spatial dimensions (e.g. x-coordinate and y-coordinate), two angular dimensions (e.g. θ-coordinate and φ-coordinate) of the incident light can also be detected.

Consequently, the plenoptic camera makes it possible not only to determine the locations at which light rays emitted by the at least one monitor radiation source impinge on the camera, but also to detect the angles at which the light rays emitted by the at least one monitor radiation source impinge on the camera. An assignment of detected light to the respective mirror element of the first mirror system which has reflected the light ray towards the plenoptic camera is possible as a result.

According to some embodiments, the plenoptic camera may comprise at least one radiation-sensitive layer and an array of lens elements arranged alongside one another, which array is arranged at a distance from the radiation-sensitive layer.

According to exemplary embodiments, the one monitor radiation source or the plurality of monitor radiation sources, the first mirror system and the plenoptic camera are arranged relative to one another such that the one monitor radiation source or the plurality of monitor radiation sources is or are imaged onto the array of lens elements, or that images of the one monitor radiation source or of the plurality of monitor radiation sources arise(s) near the lens elements of the array. In particular, the following conditions can be achieved in this case:

a plurality of the mirror elements generate images of the monitor radiation source in image planes corresponding to the respective mirror elements, distances between the image planes corresponding to the mirror elements and a plane in which the array of lens elements of the plenoptic camera are arranged have a maximum distance, distances between each of the plurality of mirror elements and the corresponding image planes have a minimum distance, and the maximum distance is less than half of the minimum distance.

If an image of a specific monitor radiation source is generated subsequent to reflection at a specific mirror element near the array of lens elements of the plenoptic camera, it is possible, by evaluating the detection signals generated by the detector, firstly to ascertain which of the plurality of lens elements the light generating the image of the monitor radiation source passes through before impinging on the radiation-sensitive layer. Given a known arrangement of the lens elements of the array relative to the remaining components of the monitor beam path, a tilting angle of the mirror element can firstly be coarsely determined therefrom. By evaluating the detection signals generated by the detector, it is then possible furthermore to ascertain at which location of the radiation-sensitive layer of the detector a light spot is generated by the light generating the image of the monitor radiation source. From the position of this location relative to that lens element of the array through which the light passes, the tilting angle of the mirror element can firstly be determined significantly more accurately therefrom.

In accordance with exemplary embodiments, the plenoptic camera comprises a lens, which is arranged in the monitor beam path between the first mirror system and the array of lens elements arranged alongside one another and through which passes the light which impinges on the lens elements of the array.

Accordance to further embodiments, an EUV lithography system comprises an EUV beam path and a monitor beam path, wherein the EUV lithography system comprises in the EUV beam path: imaging optics configured for imaging an object plane, in which a structure to be imaged can be arranged, into an image plane, in which a radiation-sensitive structure can be arranged, an EUV radiation source, a first mirror system, which is arranged in the EUV beam path between the EUV radiation source and the object plane and which comprises a base and a multiplicity of mirror elements fixed to the base, wherein orientations of the mirror surfaces relative to the base are respectively adjustable, and a second mirror system, which is arranged in the EUV beam path between the EUV radiation source and the first mirror system or between the first mirror system and the object plane and which comprises a base and a multiplicity of mirror elements fixed to the base, and wherein the EUV lithography system has in the monitor beam path: a plurality of monitor radiation sources which are in each case arranged between mutually adjacent mirror elements of the second mirror system, a detector for detecting monitor radiation reflected at mirror elements of the first mirror system, and the first mirror system, which is arranged in the monitor beam path between the monitor radiation sources and the detector.

The arrangement of the monitor radiation sources between mutually adjacent mirror elements of the second mirror system makes it possible to integrate the monitor beam path into the EUV beam path in a space-saving manner.

According to some embodiments, the first mirror system comprises at least one actuator in order to change the orientation of at least some of the mirror surfaces relative to the base. In accordance with exemplary embodiments herein, the EUV lithography system comprises a controller, which is configured for driving the at least one actuator on the basis of an output signal of the detector. As a result, it is possible to set a desired orientation of the mirror elements relative to the base in an automated manner.

According to exemplary embodiments of the EUV lithography system, the EUV beam path and the monitor beam path can be operated independently of one another, such that also during operation of the EUV beam path, that is to say imaging of the structure to be imaged onto the radiation-sensitive structure, orientations of the mirror elements can be detected and, if appropriate, corrected.

According to some embodiments, the screen is provided by a radiation-sensitive layer of the detector. It is thus possible for the light spots generated by the mirrors to be detected on the screen directly, that is to say without the addition of further optics between the screen and the detector.

According to other embodiments, the screen comprises a light-scattering layer and the EUV lithography system furthermore comprises imaging optics in order to image the light-scattering layer onto a radiation-sensitive layer of the detector. In this case, the imaging optics and the radiation-sensitive layer of the detector can be arranged behind the screen, such that light which has passed through the light-scattering layer of the screen is imaged onto the detector, and the imaging optics and the detector can also be arranged in front of the screen, such that light which is reflected at the light-scattering layer is imaged onto the detector.

Accordance to exemplary embodiments herein, the imaging—provided by the imaging optics—of the screen onto the radiation-sensitive layer of the detector is a demagnifying imaging, such that the region of the screen on which light spots generated by the mirror elements impinge and which is imaged onto the detector can be significantly larger than an extent of the radiation-sensitive layer of the detector.

According to some embodiments, the mirror elements have reflection surfaces having a shape which is elongated in plan view. By way of example, a length of the reflection surfaces in plan view can be more than five times or more than ten times greater than the width thereof.

According to exemplary embodiments herein, the mirror elements can be arranged in rows alongside one another, wherein centres of the mirror surfaces within the rows are arranged at a distance from one another which is less than the length of the mirror surfaces, and centres of the rows of mirror elements can be arranged at a distance from one another which is greater than or equal to the length of the mirror surfaces. With regard to providing a largest possible number of mirror elements within an available area, provision is made for the mirror elements to be arranged within the rows close together, that is to say at a smallest possible distance from one another, and for at least some of the rows of mirror elements in turn to be arranged close together, that is to say at a smallest possible distance from one another.

According to exemplary embodiments, the monitor radiation source is configured for generating a plurality of separate radiation beams which impinge at a distance from one another on the mirror system, wherein each of the radiation beams impinges on one or a plurality of mirror elements of the mirror system, and wherein a lateral extent of the radiation beam as seen in the longitudinal direction of a mirror element on which the radiation beam impinges is less than the length of the mirror element. As a result, only part of the total area of the reflection surface of the mirror element contributes to the imaging of the monitor radiation source into the image of the monitor radiation source that is generated via the reflection at the mirror element. By virtue of this restriction of the aperture of the imaging, it is possible to reduce imaging aberrations of the imaging, which results in a light spot reduced in size on the screen. This in turn makes it possible that a larger number of light spots generated on the screen do not overlap one another and their positions can thus be determined more clearly and/or more accurately.

According to some embodiments, the at least one monitor radiation source comprises a plurality of radiation sources arranged alongside one another. This plurality of radiation sources arranged alongside one another can also be imaged via the mirror elements and generate light spots on the screen. This firstly leads, on an extended screen, to an increased number of light spots, since each individual mirror element generates a number of light spots on the screen that corresponds to the number of radiation sources.

In this case, it is possible that even within a small part of the extended screen, at least one light spot is generated by each mirror element, in which case, however, these light spots are then generated by light rays which emerge from different light sources. Therefore, this comparatively small part of the screen already contains all the information necessary for determining the orientations of the mirror elements, with the result that it is sufficient for only the radiation intensities impinging on the relatively small part of the screen to be detected in a spatially resolved manner via the detector. The extent of the screen can thereby be significantly reduced, and, in particular, it is possible to use a comparatively small spatially resolving detector directly as a screen.

According to exemplary embodiments, the number of mirror elements and thus the number of light spots generated on the screen is large, while the extent of the light spots generated on the screen is not so small, in order to avoid an overlap of two or more light spots on the screen in all operating situations. If one or a plurality of light spots overlap on the screen, it is not easy to assign the positions of the light spots on the screen which are detected in a spatially resolved manner, unambiguously to specific mirror elements.

Accordance to particular embodiments, therefore, it is provided that the plurality of monitor radiation sources in each case emit radiation from a predetermined wavelength range and the wavelength ranges of at least two radiation sources are different from one another. By way of example, the wavelength ranges can have a width of less than 100 nm or less than 50 nm, and centres of the wavelength ranges of the radiation emitted by two different radiation sources can differ by more than 20 nm, more than 50 nm or more than 100 nm. It is then possible to use a wavelength-sensitive detector, such as a colour camera, for example, for the spatially resolved detection of the light spots. If two light spots which are generated by two different mirror elements from light from two different radiation sources then partly overlap on the screen, it is nevertheless possible, taking account of the detected colour of the individual light spots, to unambiguously determine the positions thereof on the screen.

Accordance to other embodiments, it is provided that the plurality of radiation sources emit their radiation in each case with a predetermined temporal intensity modulation, wherein the temporal intensity modulations of at least two radiation sources are different from one another. By way of example, intensity modulations which are different from one another can be achieved by each radiation source emitting in an intensity-modulated manner with a predetermined frequency of, for example, 1000 Hz, 100 Hz or 10 Hz. In this case, all the radiation sources can modulate the intensities of the radiation with an identical frequency, provided that this is not done synchronously, but rather in a phase-shifting manner.

Furthermore, it is possible for each radiation source to use a different frequency for modulating the intensity of the radiation which it emits.

In accordance with further embodiments, it is provided that the modulation of the intensity of the radiation emitted by the radiation sources is combined with the possibility of providing, for at least some of the plurality of radiation sources, different wavelength ranges of the radiation emitted by them.

In accordance with further embodiments, the monitor radiation source generates, via one or a plurality of radiation sources, radiation beams which in each case impinge on a plurality, or all, of the mirror elements of the mirror system and are reflected by the mirror elements, wherein the monitor radiation reflected by the mirror elements is detected via a plenoptic camera. In this embodiment, too, it is possible that a plurality of monitor radiation sources in each case emit radiation from predetermined wavelength ranges and the wavelength ranges of at least two radiation sources are different from one another, or/and that the plurality of monitor radiation sources emit their radiation in each case with a predetermined temporal intensity modulation, wherein the temporal intensity modulations of at least two radiation sources are different from one another, as has already been explained above.

The components of the EUV lithography system which may provide and define the EUV beam path, that is to say the EUV radiation source, the structure to be imaged, the radiation-sensitive structure, the imaging optics, the first mirror system and, if appropriate, further mirrors are in each case held on a common carrier and adjustable relative to the latter in order to set a desired position and/or orientation thereof. In order to determine the position and/or orientation of the first mirror system relative to such a common carrier, an EUV lithography system in accordance with a further embodiment comprises: imaging optics configured for imaging an object plane, in which a structure to be imaged can be arranged, into an image plane, in which a radiation-sensitive structure can be arranged, an EUV radiation source, a first mirror system, which is arranged in an EUV beam path between the EUV radiation source and the object plane and which comprises a base and a multiplicity of mirror elements which are fixed to the base, and the orientation of which relative to the base is respectively adjustable, an interferometer having a measuring arm, a monitor mirror fixed to the base of the first mirror system, and a hologram, which is arranged in the beam path of the measuring arm between the mirror and the interferometer. In this case, components of the interferometer and the hologram can be fixed to the common carrier. In the interferometer, the radiation that has passed through the measuring arm, in which the hologram and the mirror fixed to the base of the first mirror system are arranged, is superimposed with radiation that has passed through the reference arm of the interferometer. The superimposed radiation leads to an interference pattern which can be detected and analysed by a detector of the interferometer. From the analysis of the interference pattern it is possible to determine the position and orientation of the mirror and thus of the base of the first mirror system with respect to the common carrier. Depending on the position and orientation thus determined, it is possible to confirm an actuator that changes the position and orientation of the base of the first mirror system relative to the common carrier or with respect to the object plane of the imaging optics. Consequently, adjustment of the position and orientation of the first mirror system relative to the remaining components of the EUV lithography system is possible with a particularly high accuracy.

In accordance with some embodiments, provision is made for providing an interferometer, a hologram and a mirror fixed to a base of a mirror that deflects the EUV beam path also for bases of other mirrors of the EUV beam path which are different from the first mirror system described above.

BRIEF DESCRIPTION OF THE DRAWINGS

The forgoing as well as other advantageous features of the invention will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

Figure 1:
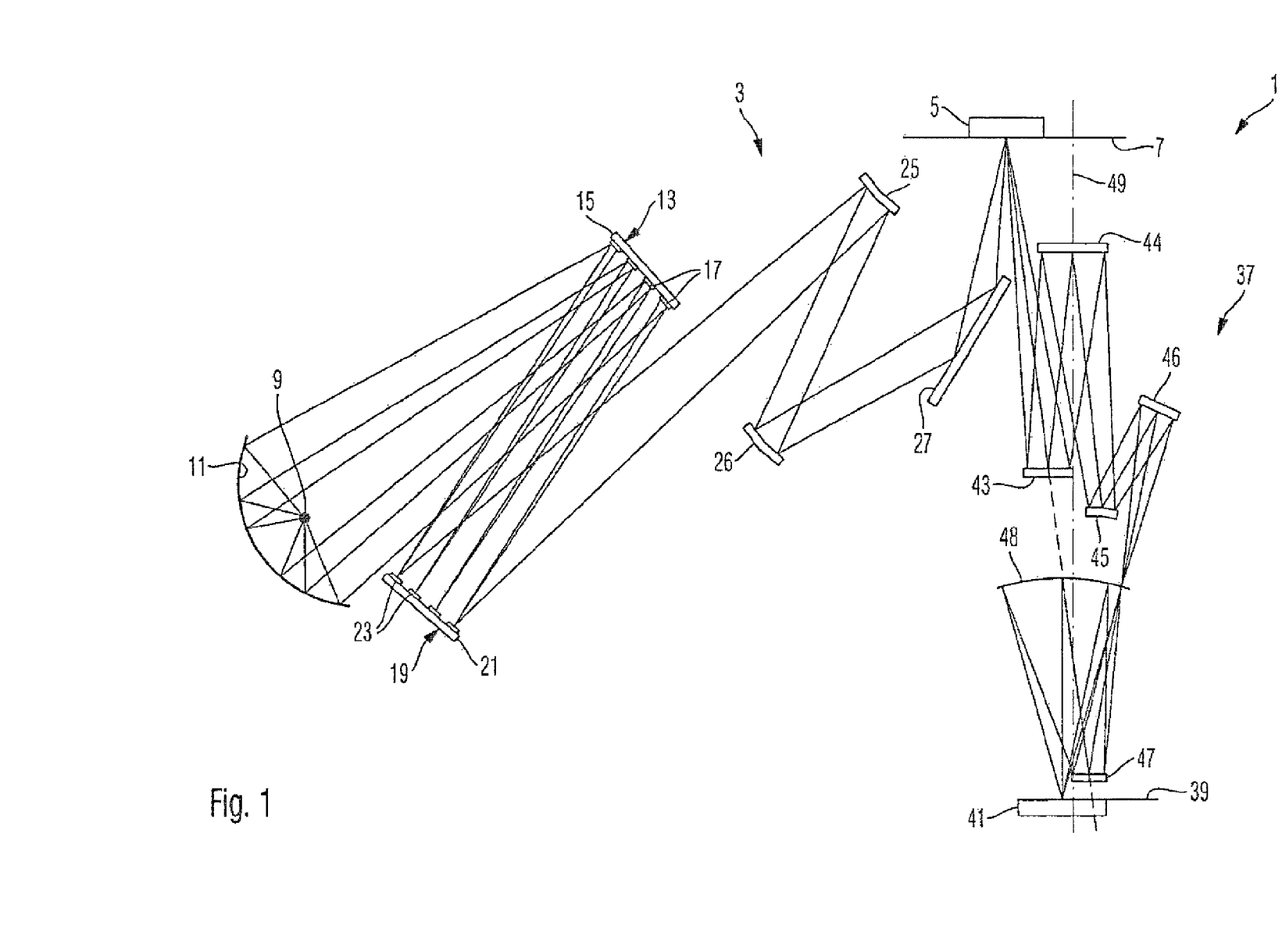
FIG. 1 shows a schematic illustration of an EUV beam path of an EUV lithography system in accordance with one embodiment.

FIG. 1 shows an EUV lithography system 1 in schematic illustration and serves for elucidating an EUV beam path 3 of the EUV lithography system. The EUV beam path 3 of the lithography system 1 serves for imaging a structure 5 to be imaged, the surface of which is arranged in an object plane 7 of the lithography system 1. For this purpose, the structure 5 to be imaged is illuminated with EUV radiation generated by an EUV radiation source 9. The EUV radiation source 9 can be a plasma radiation source, for example, which emits EUV radiation in a wavelength range of 5 nm to 15 nm, for example. Part of the radiation emitted by the EUV radiation source is reflected in collimated fashion at a collector mirror 11, with the result that it impinges on a first mirror system 13 comprising a base 15 and a plurality of mirror elements 17 fixed to the base 15. EUV radiation reflected at the mirror elements 17 impinges on a second mirror system 19 comprising a base 21 and a plurality of mirror elements 23 fixed to the base 21. EUV radiation reflected at the mirror elements 23 can be directed directly or after reflection at one or a plurality of further mirrors indirectly onto the structure 5 to be imaged. In the exemplary embodiment illustrated, the EUV radiation reflected at the mirror elements 23 is directed after reflection at three mirrors 25, 26 and 27, arranged one behind another in the EUV beam path, onto the structure 5 to be imaged.

Figure 2:
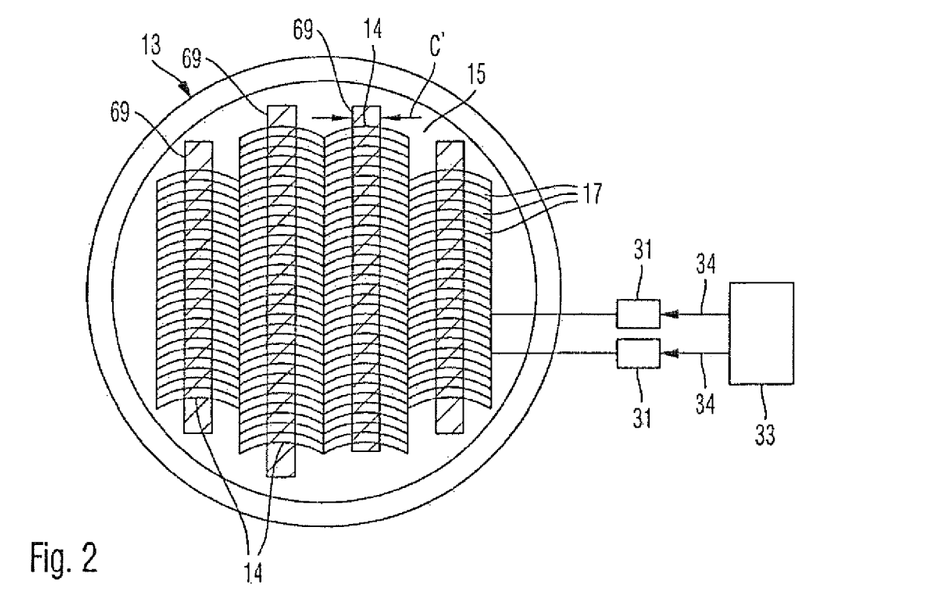
FIG. 2 shows a schematic illustration of a plan view of a mirror system having a plurality of mirror elements of the EUV lithography system of FIG. 1.

The first mirror system 13 is illustrated schematically in plan view in FIG. 2. Mirror surfaces of the mirror elements 17 have an elongated curved shape in plan view, wherein a width b of the mirror surfaces is more than five times smaller, in particular more than ten times smaller, than a length 1 of the mirror surfaces of the mirror elements 17. In the example illustrated, the mirror elements 17 are arranged closely alongside one another in four rows 14, such that the mirror surfaces of the mirror elements 17 fill the area occupied by the mirror elements as fully as possible. Centres of the mirror surface are arranged within each row 14 at a distance from one another which is significantly less than the length 1 of the mirror surfaces and is equal to or somewhat greater than the width b of the mirror surfaces. Centres of the rows 14 are arranged at a distance from one another which is equal to or somewhat greater than the length 1 of the mirror surfaces.

The EUV beam path 3 is configured such that EUV radiation illuminates in each case the entire mirror surface of all the mirror elements 17 and that the EUV radiation reflected at all the mirror elements 17 is superimposed in the object plane 7 in a single field having a shape which corresponds to the shape of a single mirror element 17 on account of the optical imaging of the mirror elements 17 onto the object plane 7, with the result that all the mirror elements 17 contribute to illuminating in the object plane 7 a single field having a curved shape having a larger length than width, wherein the illuminated field is significantly smaller than the mirror surface of a mirror element 17.

The mirror system 13 has a multiplicity of actuators 31, only two of which are illustrated by way of example in FIG. 2, in order to change an orientation of the mirror surface of a plurality or all of the mirror elements 17 relative to the base 15. The actuators 31 are controlled by a controller 33 via control lines 34. The actuators 31 are actuated by the controller 33 in order to set a desired angular distribution of the EUV radiation impinging on the object plane 7. Background information concerning such setting of the angular distribution can be gathered from EP 1 202 101 A2 and DE 10 2009 054 540.9, the disclosure of which is incorporated in its full scope in the present application.

Figure 3:
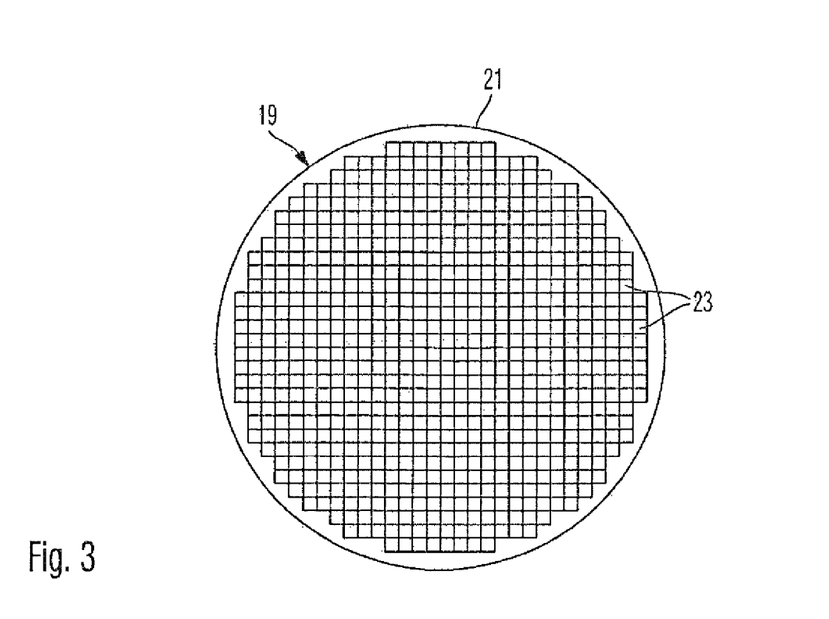
FIG. 3 shows a schematic illustration of a plan view of a further mirror system having a plurality of mirror elements of the EUV lithography system of FIG. 1.

The mirror elements 23 of the second mirror system 19 of the exemplary embodiment illustrated have, as can be seen from FIG. 3, mirror surfaces having a square shape. Other shapes of the mirror surfaces are likewise possible. The mirror elements 23 can also be adjustable with regard to their orientation relative to the base 21 of the mirror system 19 via actuators (not illustrated in FIG. 3), with the result that the EUV radiation reflected at the mirror elements 17 of the first mirror system 15 impinges, after reflection at the mirror elements 23 of the second mirror system 19, on the field to be illuminated in the object plane 7.

The EUV lithography system 1 furthermore comprises imaging optics 37 arranged in the EUV beam path 3 between the object plane 7 and an image plane 39, in which a surface of a radiation-sensitive structure 41 can be arranged and on which the structure 5 to be imaged is imaged by the imaging optics 37. For this purpose, the imaging optics 37 comprises a plurality of mirrors 43, 44, 45, 46, 47 and 48, at which the EUV radiation is reflected in turn after reflection at the structure 5 to be imaged. Although the imaging optics 37 of the exemplary embodiment illustrated has six mirrors 43 to 48 arranged along an optical axis 49 of the imaging optics 37, other examples of imaging optics may comprise a larger or a smaller number of mirrors for obtaining the imaging of the object plane 7 into the image plane 39.

Figure 4:
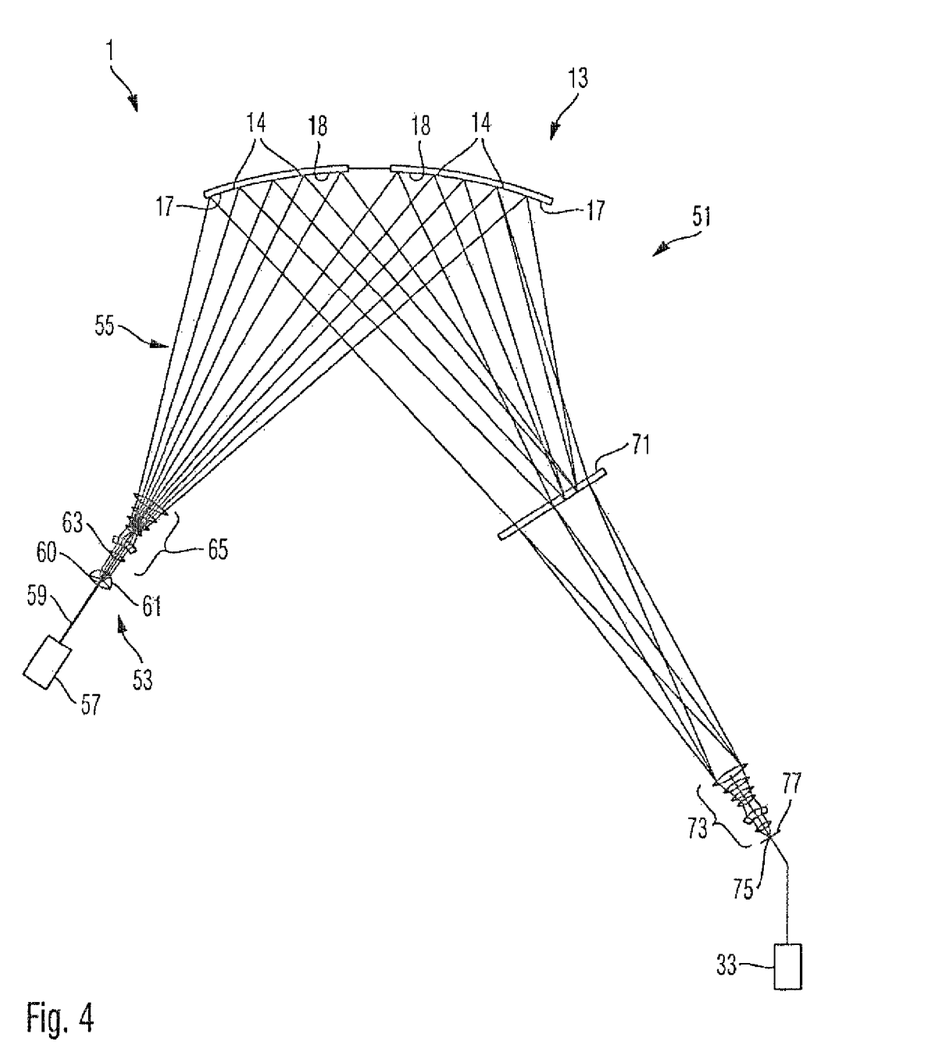
FIG. 4 shows a schematic illustration of a monitor beam path of the EUV lithography system shown in FIG. 1.

FIG. 4 shows in schematic illustration a monitor beam path 51 of the EUV lithography system 1. The monitor beam path 51 serves for determining orientations of the mirror surfaces of the mirror elements 17 of the first mirror system 13 relative to the base 15 thereof. For this purpose, the EUV lithography system 1 comprises a monitor radiation source 53, which is configured for directing a plurality of radiation beams 55 of monitor radiation onto the mirror elements 17 of the mirror system 13. In the example illustrated, the monitor radiation is generated by a semiconductor laser 57 or a light emitting diode, is coupled into an optical fibre 59 and emerges from the latter at the end 60 thereof.

The monitor radiation emerging from the optical fibre 59 is collimated by a lens element 61 and split into a plurality of radiation beams by a diffractive optical element 63, the radiation beams being directed onto the mirror elements 17 of the mirror system 13 by a lens element system 65. On account of the splitting of the monitor radiation into the plurality of radiation beams 55, the monitor radiation does not impinge over the whole area on the mirror surfaces of the mirror elements 17. In FIG. 2, hatched rectangles 69 represent the cross sections of the radiation beams 55 on the mirror surfaces 18 of the mirror elements 17. It can be seen that a width c of the radiation beams is less than the length 1 of the mirror surfaces 18 of the mirror elements 17.

The mirror surfaces of the mirror elements 17 reflect the impinging monitor radiation and focus the latter to form individual light spots that arise on a screen 71. The screen is designed to scatter light and consists of milk glass, for example. Each of the mirror elements 17 generates on the screen 71 a light spot which is illuminated with monitor radiation and the position of which on the screen 71 is dependent on the orientation of the associated mirror element 17 relative to the base 15 of the mirror system 13. Imaging optics 73 is arranged behind the screen 71, and images the screen 71 onto a radiation-sensitive layer 75 of a CCD camera chip 77. This imaging can be demagnifying, with the result that the screen 71, which can have a diameter of a plurality of centimeters, can be completely imaged onto a commercially available camera chip 77, which can have a diameter of less than one centimeter.

An image detected by the camera chip 77 is output to the controller 33. The controller 33 can analyse each image with regard to a distribution of radiation intensities in the image and thus determine the positions of the spots of monitor radiation generated on the screen. From these positions in turn, the controller 33 can determine the orientations of the mirror elements 17 relative to the base 15 of the mirror system 13. If these orientations do not correspond to desired orientations, the controller 33 can drive the actuators 31 (FIG. 2) in order to produce the desired orientations of the mirror elements.

Figure 5:
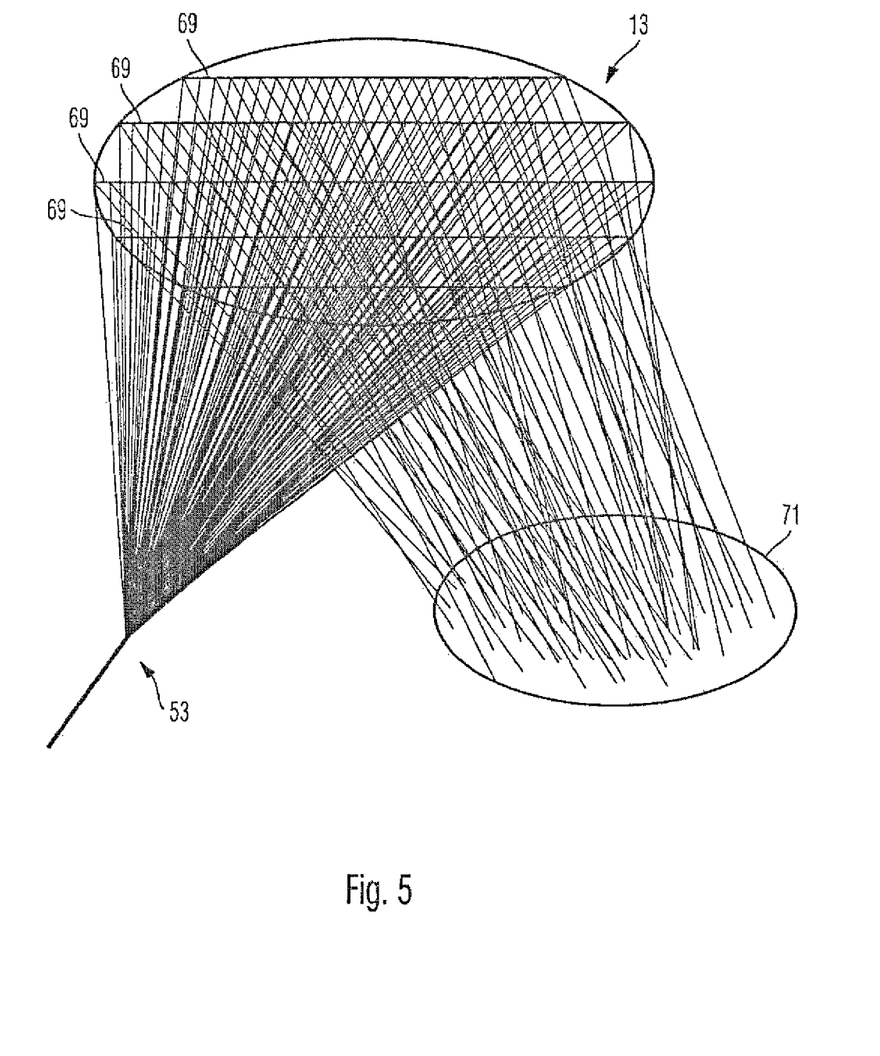
FIG. 5 shows a perspective schematic illustration of the monitor beam path of the EUV lithography system shown in FIG. 1.

FIG. 5 is a schematic perspective illustration representing beam courses of the monitor radiation, wherein the beam path of the respective monitor radiation is represented as lines for each mirror element 17 of the mirror system 13.

Figure 6:
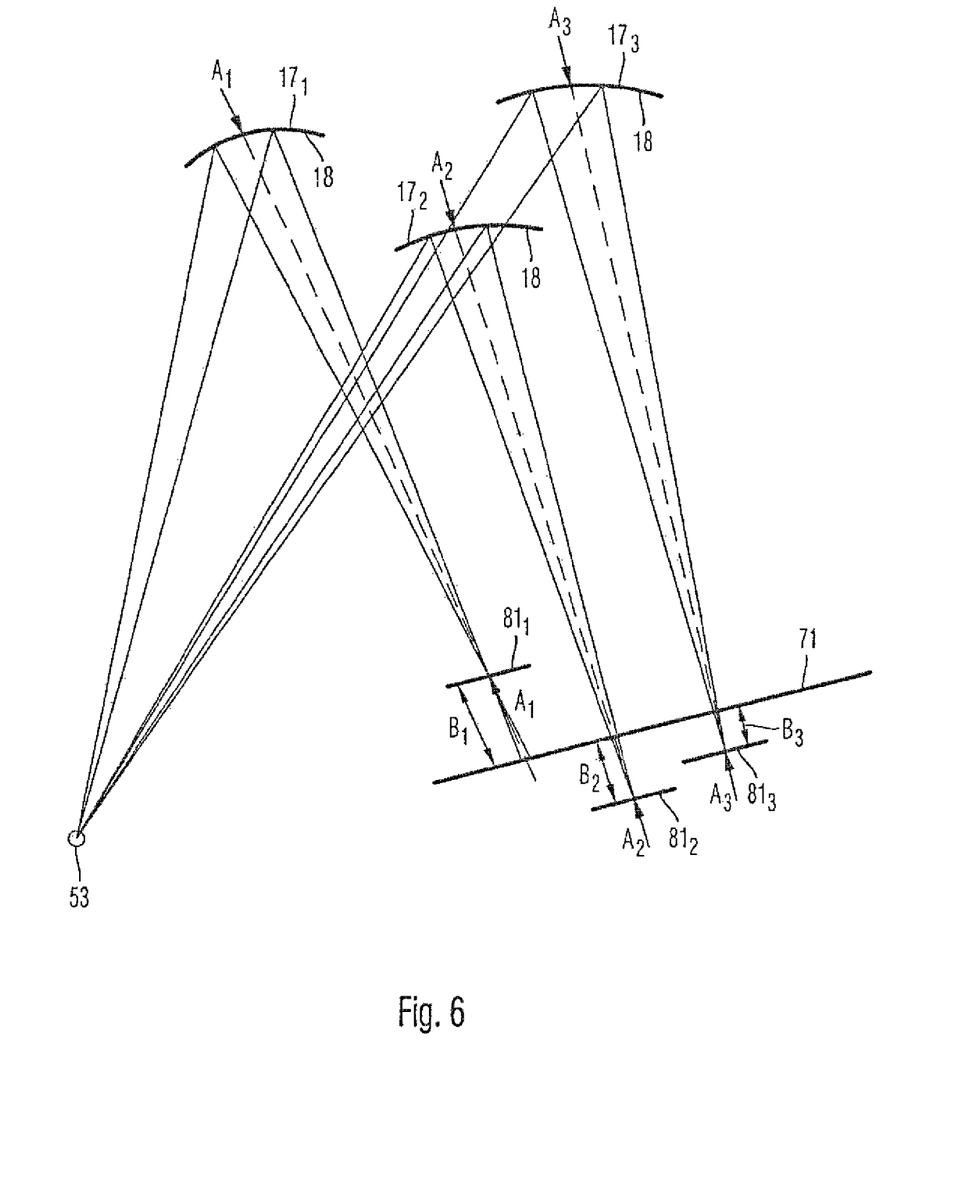
FIG. 6 shows a schematic illustration of properties of the monitor beam path of the EUV lithography system shown in FIG. 1.

FIG. 6 is a schematic illustration for elucidating geometrical relations between the monitor radiation source 53, the mirror elements 17 and the screen 71. In FIG. 6, the monitor radiation source 53 is illustrated as a point source that directs radiation beams of monitor radiation onto three mirror elements $17_1$, $17_2$, $71_3$ illustrated by way of example. The mirror elements $17_1$, $17_2$, $71_3$ each have a concavely curved mirror surface 18, which generate an image of the monitor radiation source 53 respectively in the planes $81_1$, $81_2$, $81_3$ assigned to the mirror surfaces. The image planes $81_1$, $81_2$, $81_3$ do not necessarily lie in a common plane. However, the screen 71 is arranged near the image planes $81_1$, $81_2$, $81_3$, since the following properties are fulfilled: the distances between the mirror elements $17_1$, $17_2$, $71_3$ and the image planes $81_1$, $81_2$, $81_3$ generated by the respective mirror elements $17_1$, $17_2$, $71_3$ can be different from one another and are designated by $A_1$, $A_2$ and $A_3$, respectively, in FIG. 6. These distances have a minimum, which is the distance $A_2$ in the illustration in FIG. 6. The image planes 81 in turn have different distances from the screen 71, which are designated by $B_1$, $B_2$ and $B_3$, respectively, in FIG. 6. These distances have a maximum, which is the distance $B_1$ in the illustration in FIG. 6. This maximum distance $B_1$ is less than half, and in particular less than one quarter, of the minimum distance $A_2$. In practice, it is possible for the image planes 81 all to lie very close to the screen and possibly to coincide with the surface thereof. In this case, the light spots generated by the monitor radiation on the screen 71 are particularly small, such that the probability of two light spots overlapping one another is particularly low. The fact that the cross sections 69 (FIG. 2) of the monitor radiation directed onto the mirror elements 17 are less than the lengths 1 of the mirror elements also contributes to this. As a result, imaging aberrations during the imaging of the ideally punctiform monitor radiation source 53 onto the screen are reduced and an extent of light spots generated on the screen is likewise reduced.

Nevertheless, the light spots generated on the screen 71 have a finite diameter, and, given the large number of mirror elements 17, the probability of two or more light spots overlapping on the screen does indeed exist. There is the problem of nevertheless determining the positions of the overlapping light spots on the screen 71 as accurately as possible, and then assigning these positions to the associated mirror elements, and finally determining the orientations thereof.

Although a demagnifying imaging of the screen onto the camera 77 is illustrated in the example in FIG. 4, it is desirable to dispense with such an imaging and to directly determine the light spots generated via the monitor radiation on the screen, for example by positioning a camera chip such that the radiation-sensitive layer thereof is arranged at the position of the screen 71 illustrated in FIG. 4 and performs the function of the screen. In practice, however, the light spots 71 in the position of the screen are distributed over such a large area that a camera chip of corresponding size is very expensive or is not commercially available. One possibility for solving this problem is explained below with reference to FIGS. 7*a* and 7*b*.

Figure 7A:
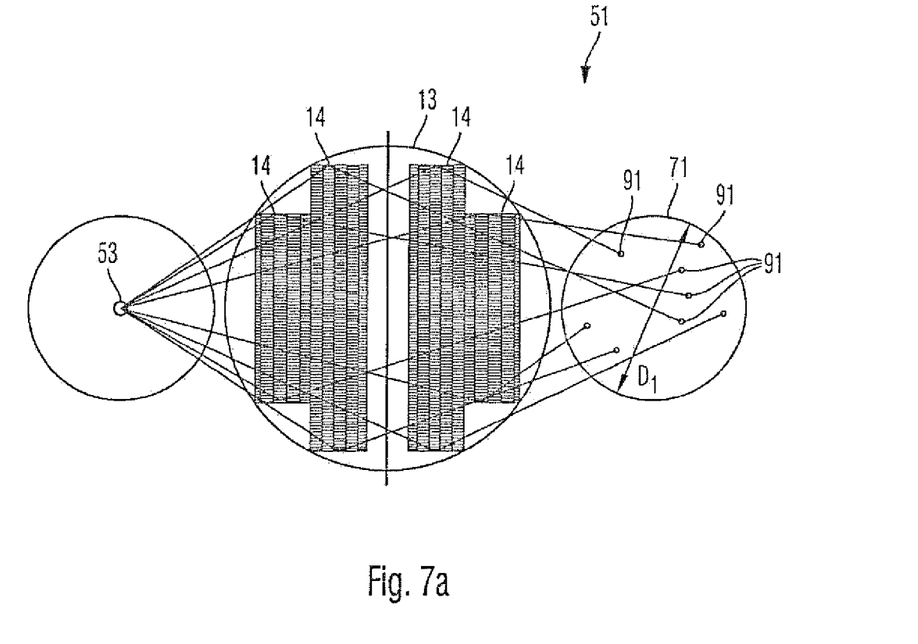
FIG. 7a shows a further schematic illustration of the monitor beam path of the EUV lithography system shown in FIG. 1.

FIG. 7*a* shows an illustration of the monitor beam path 51 schematically in a plan view of the mirror elements of the mirror element 13. A substantially punctiform monitor radiation source 53 generates, after reflection at the mirror elements, a multiplicity of light spots 91 on the screen 71, wherein only some of the light spots 91 generated and the associated rays thereof are illustrated, by way of example in FIG. 7*a*. The light spots 91 are arranged in a manner distributed over the screen 71 having the diameter D1. In order to be able to determine the orientation of each mirror element 17, the positions of all the light spots 91 on the screen 71 have to be detected, for which purpose it is necessary to image the entire diameter D1 of the screen 71 onto the detector or to arrange a detector at the position of the screen 71 having the large diameter D1.

Figure 7B:
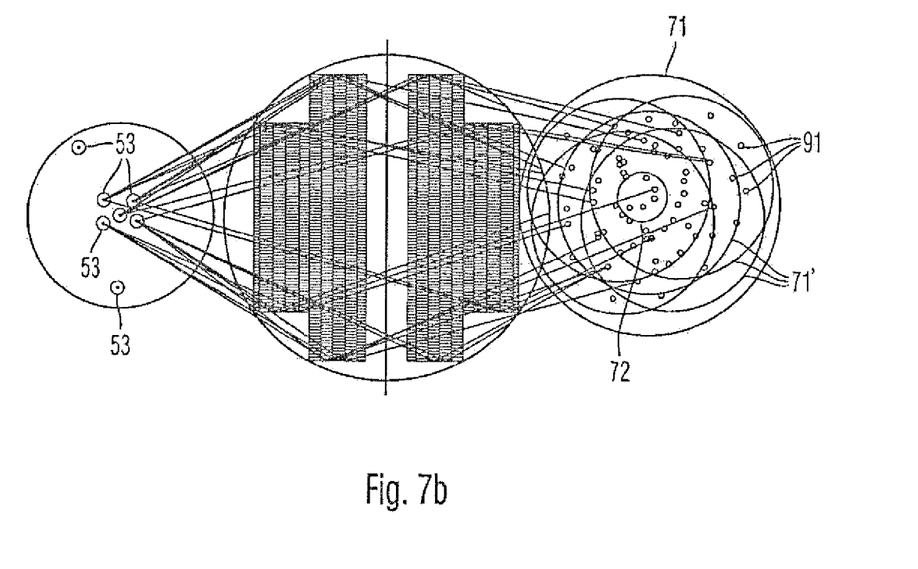
FIG. 7b shows an illustration—corresponding to FIG. 7a—of a monitor beam path of an EUV lithography system in accordance with a further embodiment.

FIG. 7*b* shows a further embodiment of an EUV lithography system having a plurality of monitor radiation sources 53. The monitor radiation sources 53 are arranged alongside one another and at a lateral distance from one another and in each case direct their light, if appropriate as radiation beams whose beam diameters at the location of the mirror elements are less than the lengths of the mirror elements, onto the mirror elements and generate light spots 91 on the screen 71. By comparison with the example in FIG. 7*a*, the number of light spots on the screen 71 in FIG. 7*b* is multiplied by the number of radiation sources 53. Each mirror element generates on the screen 71 a number of light spots 91 corresponding to the number of light sources 53. However, the light spots generated by a mirror element are laterally offset with respect to one another, since the plurality of light sources 53 are also arranged at a distance alongside one another. Circles 71' in FIG. 7*b* represent the areas within which all the light spots 91 are arranged which arise from a single radiation source 53 via reflection at all the mirror elements. The circles 71' are offset relative to one another, since the radiation sources 53 are also arranged at a distance from one another. A circle 72 in FIG. 2 represents a region of the screen which is small in comparison with the diameter of the screen and within which spots 91 from all the mirror elements 17 are arranged, these spots being generated, however, by monitor radiation which is reflected at the mirror elements and which emerges from different light sources 53. Since, within the circle 72, each mirror element 17 generates a light spot 91, it is sufficient, for determining the orientation of all the mirror elements, to image only the region 72 that is small in comparison with the diameter 71 of the screen onto the detector or to arrange at the position of the screen 71 a detector having a diameter which corresponds to the diameter of the circle 72.

On account of the increased number of light spots 91 on the screen 71 in the example in FIG. 7*b*, there is also an increased probability of two or more light spots overlapping on the screen, and it is then difficult to determine the position of the light spots on the screen and to assign the positions to specific mirror elements. In order to solve this problem, it is provided that the plurality of radiation sources 53 emit the monitor radiation in different wavelength ranges. Thus, the wavelength ranges in which the radiation sources emit can be different from one another in pairs, such that the monitor radiation is emitted overall in a number of wavelength ranges corresponding to the number of radiation sources. It is likewise possible to form groups of monitor radiation sources, wherein the wavelength ranges between groups are different from one another in pairs. Spots of different colours then arise on the screen, depending on the radiation source from which the monitor radiation generating the spot emerges. The detector is then preferably designed to be wavelength-sensitive, or optionally different barrier filters are arranged between the screen and the detector in the beam path of the imaging optics 77 shown in FIG. 4, wherein the barrier filters only transmit the monitor radiation generated by a specific monitor radiation source. Consequently, it is possible for even mutually overlapping spots on the screen which are generated by different monitor radiation sources to be unambiguously assigned to their associated mirror elements.

Supplementarily or alternatively thereto, it is also possible for each of the radiation sources 53 to emit their monitor radiation with temporal intensity modulation. In this case, it is possible for the intensity modulations of all the radiation sources to be different from one another in pairs or for groups of radiation sources to be formed, wherein the intensity modulations within each group are identical, but from group to group are different from one another in pairs. In the case of known temporal intensity modulation of each monitor radiation source, it is possible, via temporally resolved analysis of the detected images, to assign the detected light spots to an associated monitor radiation source or a group of monitor radiation sources.

Figure 8:
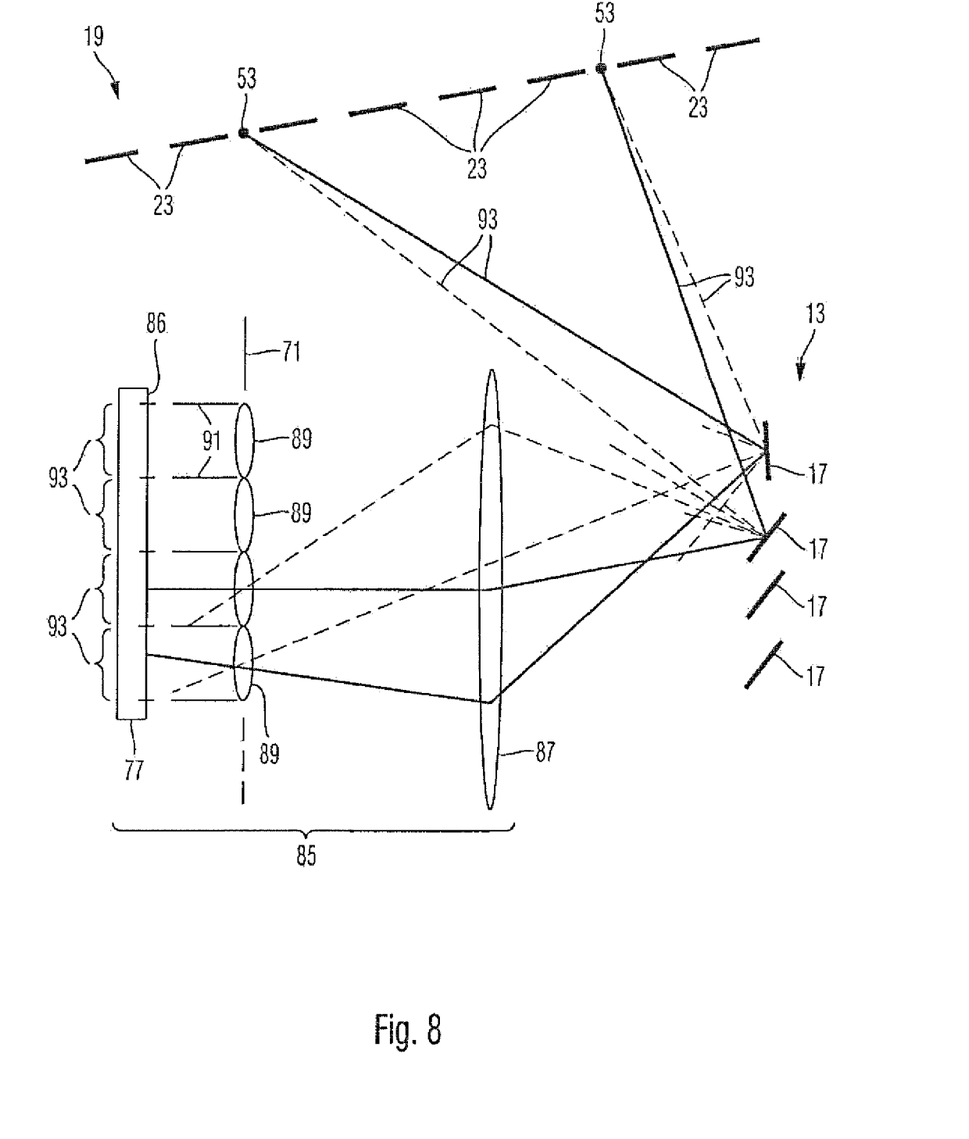
FIG. 8 shows a schematic illustration of a further embodiment of a monitor beam path of the EUV lithography system shown in FIG. 1.

FIG. 8 shows a schematic illustration of a further embodiment of a monitor beam path 51, which can be realised in the EUV lithography system explained with reference to FIGS. 1 to 3. A plenoptic camera 85 is arranged in the monitor beam path 51 shown in FIG. 8 in order to detect monitor radiation which is generated by monitor radiation sources 53 and which is reflected at mirror elements 17.

For this purpose, the plenoptic camera 85 comprises a camera lens 87, which can comprise an individual lens element or a lens element system composed of a plurality of lens elements, a camera chip 77 having a radiation-sensitive layer 86, and an array—arranged in a plane 71—of microlens elements 89 arranged between the camera chip 77 and the lens 87. A distance between the microlens elements 89 and the radiation-sensitive layer 86 can correspond to a focal length of the microlens elements 89, but can also be chosen to be larger or smaller. Furthermore, it is possible for the plenoptic camera not to have a separate lens 87 and for the rays reflected at the mirror elements 17 to impinge directly on the array of microlens elements 89. A number of microlens elements 89 of the array can be more than 100, more than 1000 or more than 10 000. The camera chip 77 is spatially resolving and can be a CCD chip, for example, which has a number of pixels greater than the number of microlens elements 89 of the array. By way of example, the number of pixels can be more than 10, more than 100 or more than 1000 times greater than the number of microlens elements 89. Lines 91 in FIG. 8 represent barrel-like tubes which extend partly between the microlens elements 89 and the radiation-sensitive layer 86 in order to restrict an angular range of the radiation which passes through the microlens elements 89 and impinges on the radiation-sensitive layer 86, or to reduce a crosstalk between regions 93 of the radiation-sensitive layer 86 which are respectively assigned to a microlens element 89. However, such partitions 91 need not necessarily be provided.

The components of the monitor beam path 51 can be configured and oriented relative to one another such that images of the monitor radiation sources 53 arise in the plane 71 or near the plane 71. This is the case for example when the geometrical relations explained above with reference to FIG. 6 are fulfilled, wherein the reference sign 71 in FIG. 6 then does not designate a screen, but rather the position of the plane in which the array of microlens elements 89 of the plenoptic camera is arranged.

FIG. 8 shows exemplary light rays 93 which emerge from two radiation sources 53, are reflected at two of the plurality of mirror elements 17 and impinge on the array of microlens elements 89 of the plenoptic camera 85. In this case, light rays which impinge on the array of microlens elements 89 at an excessively large angle with respect to the perpendicular and are absorbed by the walls 91 and are therefore not detected are illustrated in a dashed fashion, while the rays 93 which are directed by the microlens elements 89 onto the radiation-sensitive layer 86 are illustrated by solid lines.

A light ray directed onto the radiation-sensitive layer 86 by one of the microlens elements 89 generates a light spot on the radiation-sensitive layer 86 whose position within a region 93 is dependent on the position relative to the associated microlens element 89 at or near which the image of the corresponding monitor radiation source 53 is generated. Thus, from the position of the detected light spot, it is possible to deduce the position of the image of the monitor radiation source 53 in the plane 71 and from that in turn the tilting angle of the associated mirror element. Since small changes in the position of the image of the monitor radiation source 53 in the plane 71 on account of the microlens element lead to a comparatively large change in the position of the detected light spot on the radiation-sensitive layer, the tilting angle of the mirror element can be detected with relatively high accuracy in this way.

Only two light sources 53 are illustrated in FIG. 8. However, significantly more radiation sources can be arranged in the monitor beam path 51. In this case, the plurality of radiation sources 53 can emit monitor radiation having different wavelengths and/or having different temporal intensity modulations, thereby facilitating an assignment of the detected monitor radiation to individual radiation sources 53 and mirror elements 17, as has already been explained above.

FIG. 8 furthermore shows a possible integration of the monitor beam path 51 with the EUV beam path in such a way that the monitor beam path takes up comparatively little additional structure space relative to the EUV beam path. Specifically, the monitor radiation sources 53 are arranged between adjacent mirror elements of a further mirror system 19 of the EUV beam path. In this case, the radiation sources 53 can be arranged for example between gaps that exist anyway between adjacent mirror elements 23, or it is then possible, if sufficiently large gaps do not exist between the mirror elements 23, to omit individual mirror elements and to replace them by a monitor radiation source 53.

The monitor radiation sources 53 can be realized, for example, by fibre ends of optical waveguides which guide light from a remotely arranged radiation source to locations between the mirror elements 23, with the result that the light is emitted from the fibre ends towards the mirror elements 17 to be measured and the fibre ends thus act as an individual light source of the monitor radiation source.

Figure 9:
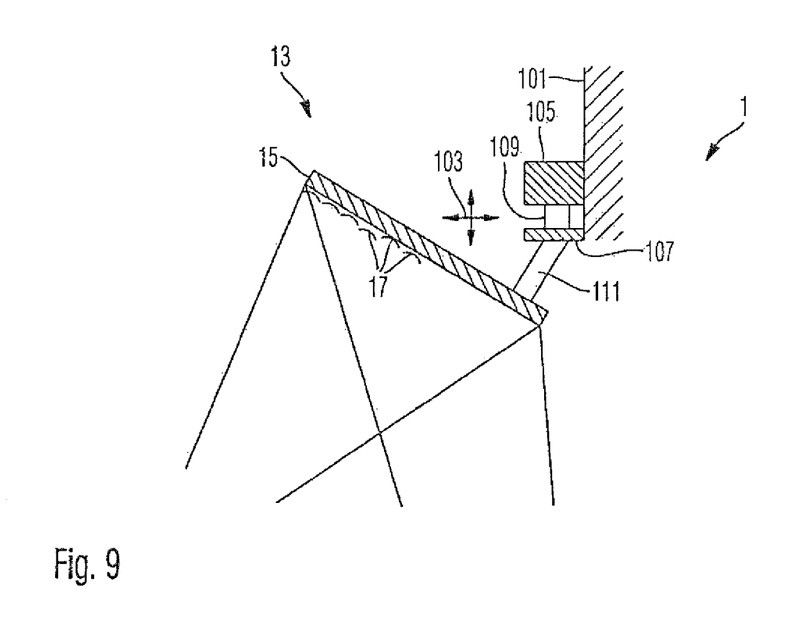
FIG. 9 shows a schematic illustration of a detail of an EUV lithography system in accordance with a further embodiment.

FIG. 9 shows in schematic illustration a detail of a further embodiment of an EUV lithography system 1, which can have a similar construction to the lithography system explained with reference to FIG. 1 and which comprises a mirror system 13 having a multiplicity of mirror elements 17 fixed to a common base 15 of the mirror system. The mirror system 13 in turn is fixed to a common carrier 101 within the EUV lithography system and is adjustable relative to the common carrier with regard to position and orientation, as is indicated by arrows 103 in FIG. 9. Even further components of the EUV lithography system 1 are fixed to the carrier 101, such as, for example, a mount for the structure to be imaged, a mount for the radiation-sensitive structure, components of the imaging optics and the EUV radiation source. The position and orientation of the mirror system 13 relative to the carrier 101 and thus relative to the remaining components of the EUV lithography system 1 are intended to be effected with very high precision.

While exemplary embodiments for adjusting the orientations of the mirror elements of the mirror system relative to the base of the mirror system have been explained with reference to FIGS. 1 to 8, an embodiment of the EUV lithography system which makes it possible to position the mirror system 13 overall, i.e. the base 15 thereof relative to the carrier 101, will be explained with reference to FIGS. 9 to 12. For this purpose, the EUV lithography system 1 comprises an interferometer 105 comprising a coherent light source for generating a measurement beam, a beam splitter for splitting the measurement beam into a reference arm and a measuring arm and a detector in order to detect an interference pattern generated by the superimposition of radiation which has passed through the reference arm with radiation which has passed through the measuring arm. The interferometer 105 is fixed to the carrier 101. A hologram 107 is likewise fixed to the carrier 101, through which hologram the measurement radiation 109 output in the measuring arm of the interferometer 105 passes. The hologram is a diffractive optical element which can be produced for example by calculation on a computer and production for example with the aid of an electron beam device. The hologram 107 is coordinated with a mirror 111 fixed to the base 15 of the mirror system 13. The radiation 109 of the measuring arm of the interferometer 105 is reflected at the mirror 111, passes through the hologram 107 again and is then superimposed with the radiation of the reference arm in the interferometer 105. Tiny displacements of the mirror 111 relative to the hologram 107 lead to measurable changes in the interference pattern detected by the detector of the interferometer 105, with the result that even tiny displacements or position errors of the base 15 of the mirror system 13 relative to the carrier 101 can be detected via the interferometer 105.

Figure 10:
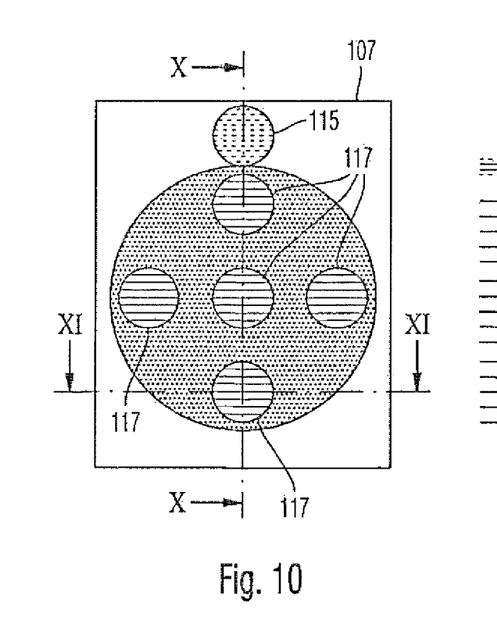
FIG. 10 shows a plan view of a hologram of the EUV lithography system shown in FIG. 9.

FIG. 10 shows a plan view of the hologram 107, which has a plurality of functional regions 115 and 117. Within the functional regions, diffractive structures of the hologram are formed in such a way that they diffract the impinging measurement radiation in a specific manner. This can be seen from the cross sections in FIGS. 11 and 12.

Figure 11:
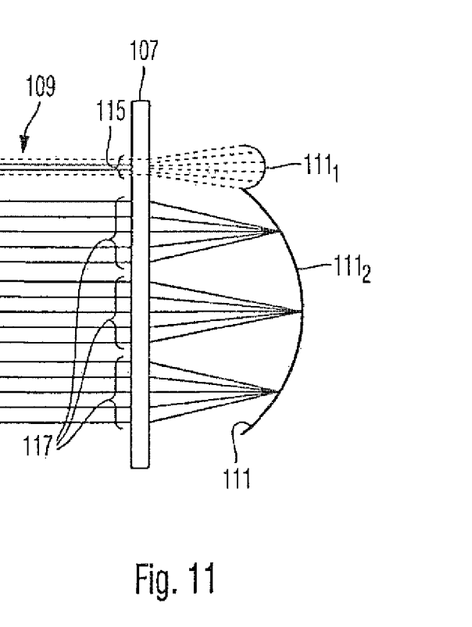
FIG. 11 shows a schematic illustration of beam paths through the hologram shown in FIG. 10 in section along a line X-X from FIG. 10.
Figure 12:
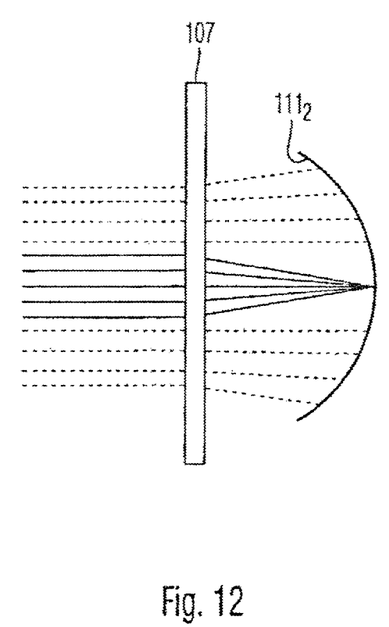
FIG. 12 shows a schematic illustration of beam paths through the hologram shown in FIG. 10 in section along a line XI-XI from FIG. 10.

FIG. 11 shows that the mirror 111 has two functional regions $111_1$ and $111_2$, wherein the mirror surface has a spherical shape in the region $111_1$ and the mirror surface has an aspherical shape in the region $111_2$. The functional region 115 of the hologram 107 diffracts the parallel incident measurement radiation 109 such that individual rays impinge substantially orthogonally on the spherical mirror surface 111 and are reflected back on themselves. The functional regions 117 of the hologram 107 diffract the radiation 109 such that point foci arise on the aspherical mirror surface in such a way that the measurement radiation is likewise reflected back on itself. In the case of a slight displacement of the mirror 111 relative to the hologram 107, the abovementioned conditions that the measurement radiation is reflected back on itself after orthogonally impinging on the spherical mirror surface $111_1$ or the formation of point foci on the aspherical mirror surface $111_2$ are no longer met, which is detected from the corresponding change in the interferogram detected by the interferometer 105. The position and/or the orientation of the base 15 relative to the carrier 101 can then be changed via actuators until the abovementioned conditions are met and the resulting interferogram has a desired shape.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

The invention claimed is:

1. A system having a first beam path and a second beam path different from the first beam path, the system comprising:
imaging optics in the first beam path, the imaging optics configured to image an object plane into an image plane;
a first mirror system in the first beam path upstream of the object plane, the first mirror system comprising a base and a plurality of mirror elements supported by the base, each mirror element having a mirror surface with an orientation which is adjustable relative to the base;
a second mirror system in the first beam path upstream of the object plane, the second mirror system comprising a base and a plurality of mirror elements supported by the base,
a plurality of radiation sources in the second beam path, each radiation source being arranged between adjacent mirror elements of the second mirror system;
a detector in the second beam path,
wherein:
the first mirror system is in the second beam path between the radiation sources and the detector;
the detector is configured to detect radiation reflected from mirror elements of the first mirror system; and
the system is an EUV lithography system.

2. The system of claim 1, wherein the second mirror system is upstream of the first mirror system along the first beam path.

3. The system of claim 1, wherein the second mirror system is downstream of the first mirror system along the first beam path.

4. The system of claim 1, further comprising a radiation source configured to produce EUV radiation that travels through the system along the first beam path.

5. The system of claim 1, further comprising:
a screen in the second beam path; and
a detector in the second beam path, the detector being configured to detect in a spatially resolved manner radiation intensities impinging on the screen during use of the system,
wherein:
the first mirror system is in the second beam path between the plurality of radiation sources and the screen;
during use of the system, each mirror element generates an image of the plurality of radiation sources in an image plane corresponding to the mirror element;
there is a maximum distance among the distances between the screen and the image planes of the mirror elements;
there is a minimum distance among the distances between the mirror elements and their respective image planes;
the maximum distance is less than half of the minimum distance.

6. The system of claim 1, wherein the detector is a plenoptic camera.

7. The system of claim 1, further comprising a plurality of actuators configured to change the orientation of at least some of the mirror surfaces relative to the base.

8. The system of claim 7, further comprising a controller configured to control the actuators based on a signal from the detector.

9. The system of claim 1, wherein:
each mirror surface has a width and a length which is at least five times greater than the width;
each radiation source is configured to generate a separate radiation beam which, during use of the system, impinges on the first mirror system at a location which is away from radiation beams generated by others of the plurality of radiation sources;

during use of the system, each radiation beam impinges on at least one of the mirror elements of the first mirror system; and during use of the system, a lateral extension of each radiation beam in a longitudinal direction of a mirror element of the first mirror system on which it impinges is less than the length of the mirror element.

10. The system of claim 1, wherein:
the mirror elements of the first mirror system are arranged in an array so that their mirror surfaces are arranged in a plurality of rows arranged adjacent one another;
centers of the mirror surfaces within the rows are arranged a distance from one another that is less than the lengths of the mirror surfaces; and
centers of the rows are arranged a distance from one another that is greater than or equal to the lengths of the mirror surfaces.

11. The system of claim 1, wherein each radiation source is configured to emit radiation having a wavelength range, and the wavelength ranges of at least two radiation sources are different from one another.

12. The system of claim 1, wherein each radiation source is configured to emit radiation having a temporal intensity modulation, and the temporal intensity modulations of at least two radiation sources are different from one another.

13. The system of claim 1, further comprising:
an interferometer in the second beam path, the interferometer comprising a measuring arm;
a monitor mirror in the second beam path, the monitor mirror being fixed to the base of the first mirror system; and
a hologram arranged in the second beam path between the monitor mirror and the interferometer.

14. A system having a first beam path and a second beam path different from the first beam path, the system comprising:
imaging optics in the first beam path upstream of the object plane, the imaging optics configured to image an object plane into an image plane;
a mirror system in the first beam path upstream of the object plane, the mirror system comprising a base and a plurality of mirror elements supported by the base, each mirror element having a mirror surface with an orientation which is adjustable relative to the base;
a radiation source in the second beam path;
a screen in the second beam path; and
a detector in the second beam path, the detector being configured to detect in a spatially resolved manner radiation intensities impinging on the screen during use of the system, wherein:
the mirror system is in the second beam path between the radiation source and the screen;
during use of the system, each mirror element generates an image of the radiation source in an image plane corresponding to the mirror element;
there is a maximum distance among the distances between the screen and the image planes of the mirror elements;
there is a minimum distance among the distances between the mirror elements and their respective image planes;
the maximum distance is less than half of the minimum distance; and
the system is an EUV lithography system.

15. The system of claim 14, wherein the screen comprises a radiation-sensitive layer, and the detector comprises the radiation-sensitive layer.

16. The system of claim 14, wherein the screen comprises a light-scattering layer, and the system further comprises imaging optics configured to image the light-scattering layer onto a radiation-sensitive layer of the detector.

17. The system of claim 14, wherein the screen comprises a plurality of lens elements adjacent to one another and a distance from a radiation-sensitive layer of the detector so that, during use of the system, light from the radiation source which impinges on the lens elements traverses the lens elements and impinges on the radiation-sensitive layer.

18. A system, comprising:
imaging optics in the first beam path, the imaging optics being configured to image an object plane into an image plane along a beam path;
a mirror system in the first beam path upstream of the object plane, the imaging optics comprising a plurality of mirror elements supported by a base, each mirror element having an orientation which is adjustable relative to the base;
an interferometer comprising a measuring arm;
a monitor mirror fixed to the base of the mirror system; and
a hologram in a second beam path which is between the monitor mirror and the interferometer,
wherein the system is an EUV lithography system.

19. The system of claim 18, further comprising an actuator configured to change a position and/or an orientation of the base of the mirror system relative to the object plane of the imaging optics.

* * * * *

UNITED STATES PATENT AND TRADEMARK OFFICE
CERTIFICATE OF CORRECTION

PATENT NO. : 9,448,490 B2  Page 1 of 1
APPLICATION NO. : 13/910912
DATED : September 20, 2016
INVENTOR(S) : Udo Dinger et al.

It is certified that error appears in the above-identified patent and that said Letters Patent is hereby corrected as shown below:

In the Specification

Column 4, add Lines 17-33 to the paragraph on Line 16.

Column 7, add Lines 16-50 to the paragraph on Line 15.

Signed and Sealed this
Seventh Day of March, 2017

Michelle K. Lee
*Director of the United States Patent and Trademark Office*